United States Patent
Hung et al.

(10) Patent No.: US 6,750,117 B1
(45) Date of Patent: Jun. 15, 2004

(54) SHALLOW TRENCH ISOLATION PROCESS

(75) Inventors: Yung-Tai Hung, Chiayi (TW); Lee-Jen Chen, Taipei (TW)

(73) Assignee: Macronix International Co., Ltd., Hsinchu (TW)

(*) Notice: Subject to any disclaimer, the term of this patent is extended or adjusted under 35 U.S.C. 154(b) by 10 days.

(21) Appl. No.: 10/248,164

(22) Filed: Dec. 23, 2002

(51) Int. Cl.⁷ .................................. H01L 21/762
(52) U.S. Cl. ........................................ 438/437
(58) Field of Search ................. 438/437; 257/E21.546

(56) References Cited

U.S. PATENT DOCUMENTS

| | | | | |
|---|---|---|---|---|
| 5,763,315 A | * | 6/1998 | Benedict et al. | 438/424 |
| 5,940,717 A | * | 8/1999 | Rengarajan et al. | 438/435 |
| 5,981,356 A | * | 11/1999 | Hsueh et al. | 438/424 |
| 5,989,978 A | * | 11/1999 | Peidous | 438/436 |
| 6,146,974 A | * | 11/2000 | Liu et al. | 438/435 |
| 6,200,881 B1 | * | 3/2001 | Lou | 438/424 |
| 6,207,513 B1 | * | 3/2001 | Vollrath | 438/296 |
| 6,255,194 B1 | * | 7/2001 | Hong | 438/435 |
| 6,500,726 B2 | * | 12/2002 | Lee et al. | 438/424 |
| 6,576,530 B1 | * | 6/2003 | Chen et al. | 438/435 |
| 2002/0003275 A1 | * | 1/2002 | Lee et al. | 257/510 |
| 2002/0134754 A1 | * | 9/2002 | Kim | 216/39 |
| 2002/0142550 A1 | * | 10/2002 | Kumamoto | 438/296 |
| 2003/0143854 A1 | * | 7/2003 | Chen et al. | 438/700 |

* cited by examiner

Primary Examiner—George Fourson
(74) Attorney, Agent, or Firm—Jiang Chyun IP Office

(57) ABSTRACT

A shallow trench isolation (STI) process is described. A patterned mask layer is formed on a substrate, and then a trench is formed in the substrate with the mask layer as a mask. A portion of the mask layer around the trench is removed, and a portion of the substrate around the top portion of the trench is removed with the remaining mask layer as a mask. A liner layer is formed in the trench. The liner layer on the top portion of the trench is then removed with a pre-deposition process of an HDP-CVD process. Thereafter, an insulating material is filled into the trench, and the mask layer is removed with an etchant. In STI process, the liner layer comprises a material that can also be etched by the etchant.

26 Claims, 5 Drawing Sheets

SHALLOW TRENCH ISOLATION PROCESS

BACKGROUND OF INVENTION

1. Field of Invention

The present invention relates to a semiconductor process. More particularly, the present invention relates to a shallow trench isolation (STI) process of a semiconductor device.

2. Description of Related Art

STI techniques have turned into important isolation methods in advanced semiconductor processes since STI structures occupy less areas and provide better isolation effects as compared with conventional field oxide (FOX) structures formed with the local oxidation method (LOCOS). A STI process in the prior art is described as follows.

Referring to FIG. 1A, a pad oxide layer 110 and a silicon nitride mask layer 120 are sequentially formed on a substrate 100, and are patterned subsequently. A trench 130 is then formed in the substrate 100 with the patterned silicon nitride mask layer 120 as a mask.

Referring to FIG. 18, a silicon oxide liner layer 133 is thermally grown on the surface of the trench 130, and then a silicon nitride liner layer 140 is formed on the substrate 100. Thereafter, CVD silicon oxide is filled into the trench 130 to form a STI structure 150. The filling process (not shown) comprises depositing a CVD oxide layer on the substrate 100, performing an annealing process to densify the CVD oxide layer, and then removing the CVD oxide layer outside the trench 130. During the annealing process, the silicon nitride liner layer 140 serves to reduce the stress in the substrate 100 around the trench 130.

Referring to FIG. 1C, the silicon nitride mask layer 120 is removed with an etchant such as hot phosphoric acid. At the same time, however, the silicon nitride liner layer 140 is easily over-etched to form indents 152. Therefore, the isolating effect of the STI structure 150 is reduced, and a leakage easily occurs in the channel.

SUMMARY OF INVENTION

Accordingly, this invention provides a shallow trench isolation (STI) process that is capable of protecting a silicon nitride liner layer in the trench from the etchant used for removing the mask layer.

A STI process of this invention is described below. A patterned mask layer, such as a patterned silicon nitride mask layer, is formed on a substrate, and then a trench is formed in the substrate with the mask layer as a mask. A portion of the mask layer around the trench is then removed, and a portion of the substrate around the top portion of the trench is removed with the remaining mask layer as a mask. A liner layer is formed in the trench, and then the liner layer on the top portion of the trench is removed with a pre-deposition process of a high-density plasma chemical vapor deposition (HDP-CVD) process. Thereafter, an insulating material like CVD silicon oxide is filled into the trench covering the liner layer remaining in the trench, and the mask layer is removed with an etchant. In the STI process, the liner layer comprises a material that can also be etched by the etchant for removing the mask layer, and can be a silicon nitride liner layer capable of reducing the stress in the substrate around the trench during a densification process of the insulating material.

In another STI process of this invention, a mask layer having an opening therein is formed on a substrate, and then spacers are formed on the sidewalls of the opening. A trench is formed in the substrate with the mask layer and the spacers as a mask. A thermal oxide layer is formed on the surface of the trench with a thermal oxidation process, such that bird's beaks are formed under the spacers. A liner layer is formed in the trench, and then the liner layer on the top portion of the trench is removed with a pre-deposition process of an HDP-CVD process. Thereafter, an insulating material like CVD silicon oxide is filled into the trench covering the liner layer remaining in the trench, and the mask layer is removed with an etchant. In the STI process, the liner layer comprises a material that can also be etched by the etchant for removing the mask layer, and can be a silicon nitride liner layer capable of reducing the stress in the substrate around the trench during a densification process of the insulating material.

Since the liner layer on the top portion of the trench is removed in the aforementioned STI processes of this invention, the liner layer remaining in the trench is covered by the insulating material and isolated from the etchant during the step of removing the mask layer. Therefore, the isolating effect of the STI structure is not reduced, and a leakage does not easily occur in the channel It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

First Embodiment

FIGS. 2A~2F illustrate a STI process flow according to the first embodiment of this invention.

Figure 1A:
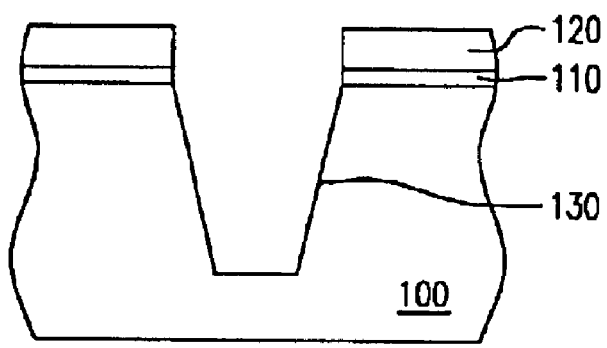
FIGS. 1A~1C illustrate a STI process flow in the prior art.
Figure 1B:
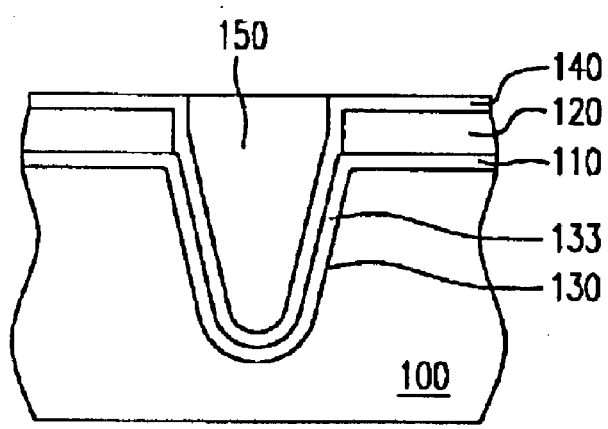
Figure 1C:
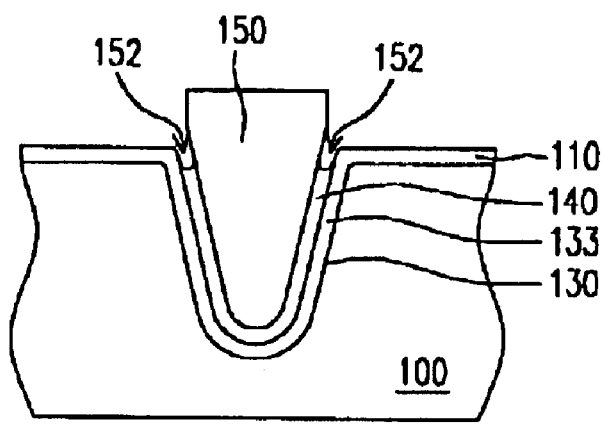
Figure 2A:
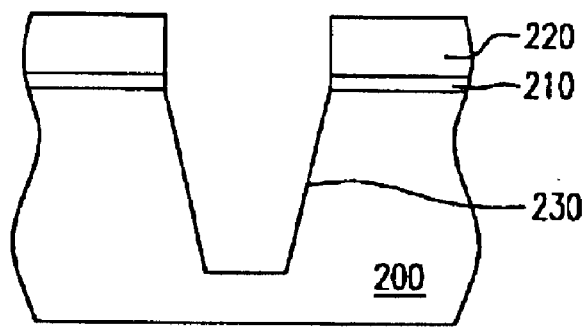
FIGS. 2A~2F illustrate a STI process flow according to a first embodiment of this invention.

Referring to FIG. 2A, a pad oxide layer 210 and a silicon nitride mask layer 220 are sequentially formed on a substrate 200. The pad oxide layer 210 is formed with, for example, a low-pressure chemical vapor deposition (LPCVD) process using $SiH_4$ and $O_2$ as reaction gases. The silicon nitride mask layer 220 is formed with, for example, a LPCVD process using $SiH_2Cl_2$ and $NH_3$ as reaction gases. The silicon nitride mask layer 220 and the pad oxide layer 210 are patterned sequentially, and then the substrate 200 is etched to form a trench 230 therein with the silicon nitride mask layer 220 as a hard mask.

Figure 2B:
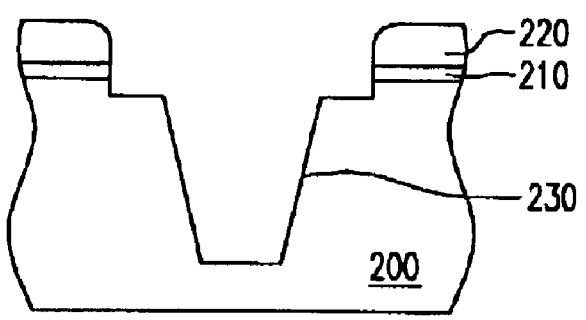

Referring to FIG. 2B, a portion of the silicon nitride mask layer 220 around the trench 230 is removed with an isotropic etching process that uses an etchant such as phosphoric acid. The exposed pad oxide layer 210 and a portion of the substrate 200 around the top portion of the trench 230 is removed with the remaining silicon nitride mask layer 220 as a mask.

Figure 2C:
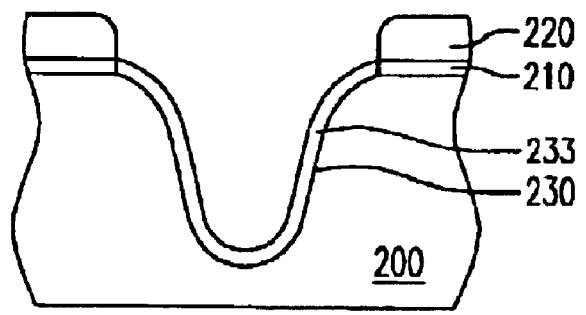
Figure 2D:
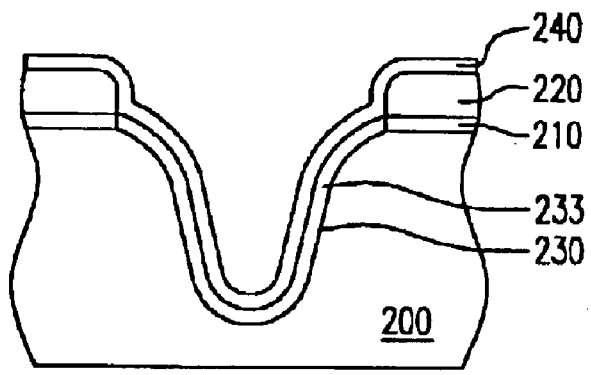

Referring to FIGS. 2C~2D, a silicon oxide liner layer 233 is formed on the surface of the trench 230 with a thermal oxidation process under a sufficiently high temperature, whereby the corners of the trench 230 are rounded. Then, a silicon nitride liner layer 240 is formed all over the substrate 200.

Figure 2E:
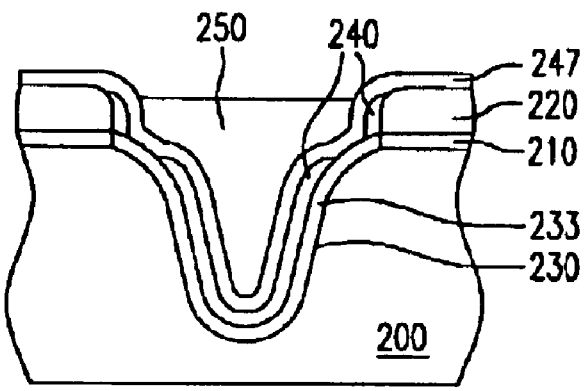

Referring to FIG. 2E, the silicon nitride liner layer 240 on the top portion of the trench 230 is removed with a pre-deposition process of an HDP-CVD process, so that the silicon nitride liner layer 240 is divided into two separate parts in the trench 230 and on the sidewalls of the silicon nitride mask layer 220, respectively. The pre-deposition process uses several reaction gases such as $O_2$, He and $SiH_4$, while the flow rates of $O_2$, He and $SiH_4$ are, for example, 215 sccm, 155 sccm and 147 sccm, respectively. In addition, the pre-deposition process is conducted under a low frequency power of 4000W and a high frequency power of 2400W, for example.

Referring to FIG. 2E again, another silicon oxide liner layer 247 is formed all over the substrate 200. An insulating material, such as TEOS oxide, is then filled into the trench 230 to form a STI structure 250. The filling process (not shown) comprises, for example, depositing an oxide layer on the substrate 200 in situ with the aforementioned HDP-CVD process directly after the pre-deposition process, performing an annealing process to densify the oxide layer, and then removing the oxide layer outside the trench 230. During the annealing process, the silicon nitride liner layer 240 serves to reduce the stress in the substrate 200 around the trench 230.

Figure 2F:
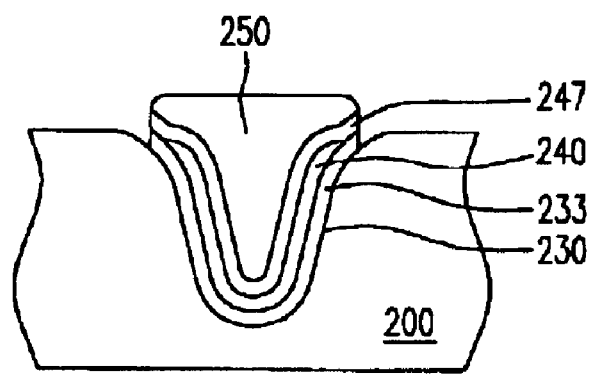

Referring to FIG. 2F, the silicon oxide liner layer 247 outside the trench, the silicon nitride mask layer 220 and the pad oxide layer 210 are sequentially removed, wherein the silicon nitride mask layer 220 is removed with an etchant such as hot phosphoric acid. Since the silicon nitride liner layer 240 remaining in the trench 230 is protected by the STI structure 250, it is not damaged by the etchant during the step of removing the silicon nitride mask layer 220. Therefore, the isolating effect of the STI structure 250 is not reduced, and a leakage does not easily occur in the channel.

Second Embodiment

FIGS. 3A–3F illustrate a STI process flow according to the second embodiment of this invention.

Figure 3A:
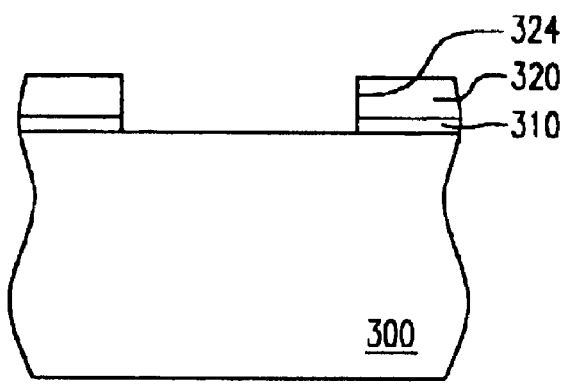
FIGS. 3A~3F illustrate a STI process flow according to a second embodiment of this invention.

Referring to FIG. 3A, a pad oxide layer 310 and a silicon nitride mask layer 320 are sequentially formed on a substrate 300. The pad oxide layer 310 is formed with, for example, a LPCVD process using $SiH_4$ and $O_2$ as reaction gases. The silicon nitride mask layer 320 is formed with, for example, a LPCVD process using $SiH_2Cl_2$ and $NH_3$ as reaction gases. Then, the silicon nitride mask layer 320 and the pad oxide layer 310 are patterned sequentially to form an opening 324 having a trench-like shape.

Figure 3B:
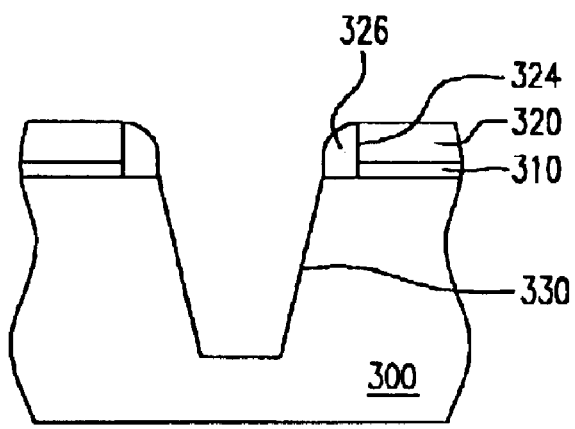

Referring to FIG. 3B, spacers 326 are formed on the sidewalls of the trench-like opening 324, and then the substrate 300 is etched to form a trench 330 with the silicon nitride mask layer 320 and the spacers 326 as a hard mask. The spacers 326 comprise a material such as silicon oxide, and are formed with a CVD process and a subsequent anisotropic etching process, for example.

Figure 3C:
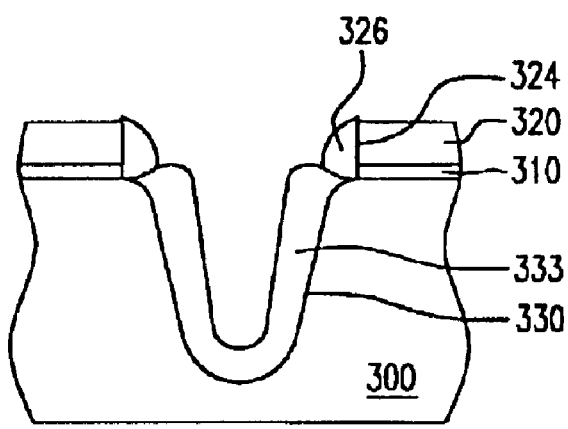

Referring to FIG. 3C, a thermal oxide layer 333 is formed on the surface of the trench 230 with a thermal oxidation process, such that bird's beaks are formed under the spacers 326.

Figure 3D:
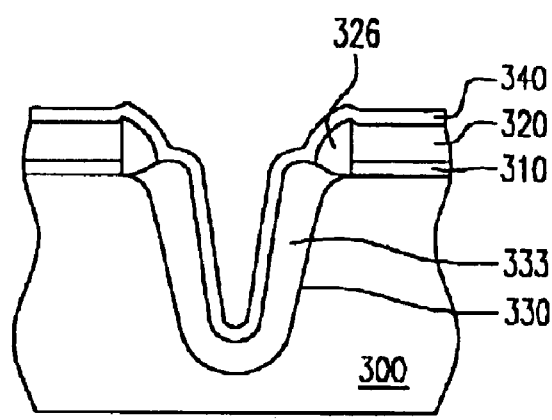
Figure 3E:
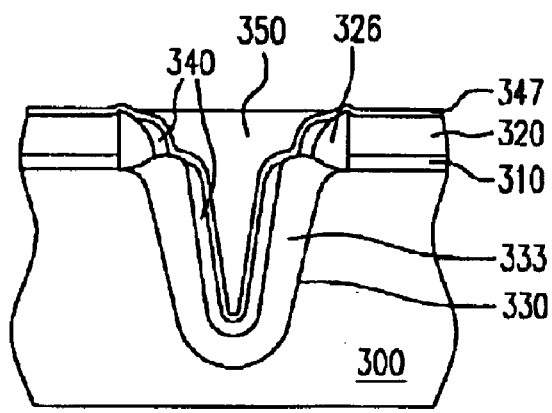

Referring to FIGS. 3D–E, a silicon nitride liner layer 340 is formed all over the substrate 300. The silicon nitride liner layer 340 on the top portion of the trench 330 is then removed with a pre-deposition process of an HDP-CVD process, so that the silicon nitride liner layer 340 is divided into two separate parts in the trench 330 and on the sidewalls of the spacers 326, respectively. The pre-deposition process uses several reaction gases such as $O_2$, He and $SiH_4$, wherein the flow rates of $O_2$, He and $SiH_4$ are, for example, 215 sccm, 155 sccm and 147 sccm, respectively. In addition, the pre-deposition process is conducted under a low frequency power of 4000W and a high frequency power of 2400W.

Referring to FIG. 3E again, a silicon oxide liner layer 347 is formed all over the substrate 300. An insulating material, such as TEOS oxide, is filled into the trench 330 to form a STI structure 350. The filling process (not shown) comprises, for example, depositing an oxide layer on the substrate 300 in situ with the aforementioned HDP-CVD process directly after the pre-deposition process, performing an annealing process to densify the oxide layer, and then removing the oxide layer outside the trench 330. During the annealing process, the silicon nitride liner layer 340 serves to reduce the stress in the substrate 300 around the trench 330.

Figure 3F:
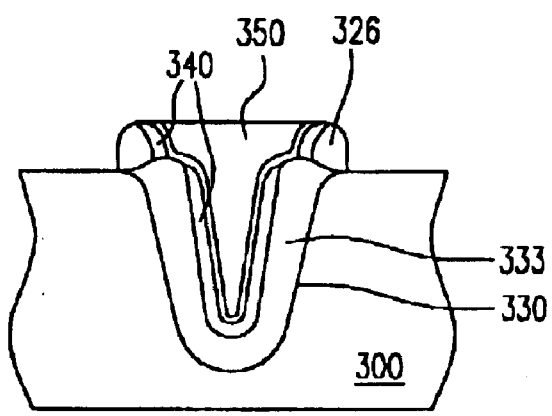

Referring to FIG. 3F, the silicon oxide liner layer 347 outside the trench 330, the silicon nitride mask layer 320 and the pad oxide layer 310 are sequentially removed, wherein the silicon nitride mask layer 320 is removed with an etchant such as hot phosphoric acid. Since the silicon nitride liner layer 340 remaining in the trench 330 is protected by the STI structure 350 and the spacers 326, it is not damaged by the etchant during the step of removing the silicon nitride mask layer 320. Therefore, the isolating effect of the STI structure 350 is not reduced, and a leakage does not easily occur in the channel.

As mentioned in the preferred embodiments of this invention, since the silicon nitride liner layer on the top portion of the trench is removed, the silicon nitride liner layer remaining in the trench is covered by the insulating material and isolated from the etchant during the step of removing the mask layer. Therefore, the isolating effect of the STI structure is not reduced, and a leakage does not easily occur in the channel.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A shallow trench isolation (STI) process, comprising:
    forming a patterned mask layer on a substrate;
    forming a trench in the substrate with the mask layer as a mask;
    removing a portion of the mask layer around the trench;
    removing a portion of the substrate around a top portion of the trench with the remaining mask layer as a mask;
    forming a liner layer in the trench;
    removing the liner layer on the top portion of the trench;
    filling an insulating material into the trench covering the liner layer remaining in the trench; and
    removing the mask layer with an etchant, wherein
        the liner layer comprises a material that can also be etched by the etchant.

2. The method of claim 1, wherein removing the liner layer on the top portion of the trench comprises performing a pre-deposition process of a high-density plasma chemical vapor deposition (HDP-CVD) process.

3. The method of claim 2, wherein the insulating material is filled with the same HDP-CVD process after the pre-deposition process.

4. The method of claim 2, wherein reaction gases used in the pre-deposition process of the HDP-CVD process comprise $O_2$, He and $SiH_4$.

5. The method of claim 4, wherein a flow rate of $O_2$ is 215 sccm, a flow rate of He is 155 sccm, and a flow rate of $SiH_4$ is 147 sccm.

6. The method of claim 2, wherein the pre-deposition process of the HDP-CVD process is conducted under a low frequency power of 4000 W and a high frequency power of 2400 W.

7. The method of claim 1, wherein the liner layer comprises a material capable of reducing stress in the substrate around the trench.

8. The method of claim 1, wherein the mask layer and the liner layer both comprise silicon nitride.

9. The method of claim 8, further comprising forming a pad oxide layer before the mask layer is formed.

10. The method of claim 8, wherein the mask layer is removed by using an etchant comprising hot phosphoric acid.

11. The method of claim 1, further comprising forming a silicon oxide liner layer in the trench before the step of forming the liner layer in the trench.

12. The method of claim 11, wherein the silicon oxide liner layer is formed with a thermal oxidation process.

13. The method of claim 1, further comprising forming a silicon oxide liner layer on the liner layer.

14. The method of claim 1, wherein removing a portion of the mask layer around the trench comprises performing an isotropic etching process.

15. The method of claim 1, wherein the insulating material comprises silicon oxide.

16. A shallow trench isolation (STI) process, comprising:

forming a mask layer on a substrate;

forming a trench-like opening in the mask layer;

forming spacers on sidewalls of the trench-like opening;

forming a trench in the substrate with the mask layer and the spacers as a mask;

forming a thermal oxide layer on surfaces of the trench with a thermal oxidation process, such that bird's beaks are formed under the spacers;

forming a liner layer in the trench;

removing the liner layer on a top portion of the trench;

filling an insulating material into the trench covering the liner layer remaining in the trench; and removing the mask layer with an etchant, wherein
the liner layer comprises a material that can also be etched by the etchant.

17. The method of claim 16, wherein removing the liner layer on the top portion of the trench comprises performing a pre-deposition process of an HDP-CVD process.

18. The method of claim 17, wherein the insulating material is filled with the same HDP-CVD process after the pre-deposition process.

19. The method of claim 17, wherein reaction gases of pre-deposition process of the HDP-CVD process comprise $O_2$, He and $SiH_4$.

20. The method of claim 19, wherein a flow rate of $O_2$ is 215 sccm, a flow rate of He is 155 sccm, and a flow rate of $SiH_4$ is 147 sccm.

21. The method of claim 17, wherein the pre-deposition process of the HDP-CVD process is conducted under a low frequency power of 4000 W and a high frequency power of 2400 W.

22. The method of claim 16, wherein the liner layer comprises a material capable of reducing stress in the substrate around the trench.

23. The method of claim 16, wherein the mask layer and the liner layer both comprise silicon nitride.

24. The method of claim 23, wherein the mask layer is removed by using an etchant comprising hot phosphoric acid.

25. The method of claim 16, further comprising forming a silicon oxide liner layer on the liner layer.

26. The method of claim 16, wherein the insulating material comprises silicon oxide.

* * * * *